United States Patent [19]

Nishihara et al.

[11] 4,298,770

[45] Nov. 3, 1981

[54] PRINTED BOARD

[75] Inventors: Mikio Nishihara, Yokohama; Masahiro Oda; Takamitsu Tsuchimoto, both of Kawasaki, all of Japan

[73] Assignee: Fujitsu Limited, Japan

[21] Appl. No.: 69,346

[22] Filed: Aug. 24, 1979

[30] Foreign Application Priority Data

Aug. 25, 1978 [JP] Japan .............................. 53/103453

[51] Int. Cl.³ ............................................ H05K 1/02
[52] U.S. Cl. .................................. 174/68.5; 361/409; 361/410
[58] Field of Search ................ 174/68.5; 361/409, 410

[56] References Cited

U.S. PATENT DOCUMENTS 2,914,706 11/1959 Hill .................................. 174/68.5 X
3,033,914 5/1962 Acosta-Lleras ..................... 174/68.5
3,470,612 10/1969 Helms ............................. 174/68.5 X
3,509,268 4/1970 Schwartz ........................... 174/68.5
3,895,181 7/1975 LaGrange ......................... 174/68.5

FOREIGN PATENT DOCUMENTS

2425399 1/1976 Fed. Rep. of Germany ..... 174/68.5
2310685 2/1976 France ............................. 174/68.5

Primary Examiner—Richard R. Kucia
Attorney, Agent, or Firm—Staas & Halsey

[57] ABSTRACT

A printed board comprising a plurality of through holes formed therein and located on intersecting points of an X-Y orthogonal basic grid, and an oblique conductor pattern, wherein conductors are formed along channels arranged in accordance with a principle that one conductor passes between adjacent grid points arranged in the X direction, while two or more conductors pass between adjacent grid points arranged in the Y direction, and each conductor obliquely extends in a zigzag line without contacting the grid points. Such conductor pattern ensures a high density and minimum length of wiring.

14 Claims, 14 Drawing Figures

PRINTED BOARD

BACKGROUND OF THE INVENTION (1) Field of the Invention

This invention relates to a printed board or printed wiring board and, more particularly, to a printed wiring of a printed board provided with a plurality of through holes located on intersecting points (hereinafter, designated as "grid points") of an X-Y orthogonal basic grid.

(2) Description of the Prior Art

With regard to a printed board, and in particular, a multilayer printed board on which a high density of wiring is required, various standardizations have been used for facilitating the design of a conductor pattern and the manufacture of the printed board. For example, through holes are located on the grid points at a standardized pitch, and the conductor pattern is formed so that the conductors pass between these grid points. For ensuring a high density of wiring under such circumstances, various kinds of conductor patterns have been proposed.

Some typical known conductor patterns will be described below, with reference to FIGS. 1 through 3 of the accompanying drawings, in order to ensure a good understanding of the background of the present invention.

Figure 1:
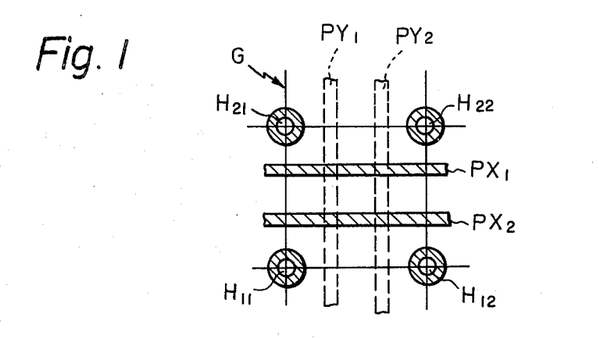
FIGS. 1, 2 and 3 illustrate various conductor patterns known in the art, as described hereinbefore.

Referring to FIG. 1, an orthogonal conductor pattern is illustrated in which through holes $H_{11}$, $H_{12}$, $H_{21}$ and $H_{22}$ are located on the grid points of an X-Y orthogonal basic grid G. Two conductors PX1 and PX2 in a conductor layer extend in the X direction, and two conductors PY1 and PY2 in another layer extend in the Y direction. Wiring between two desired points is provided by a combination of straight conductors in the X and Y directions. At a turning point of the wiring, the conductors in the different layers are connected via the through holes.

The above described orthogonal conductor pattern is advantageous in that it is simple to design and manufacture, but it is not completely satisfactory for a printed board in which a high density of wiring and high-speed signal transmission are required. For example, in a case wherein two points of a printed board which are diagonal to each other are connected in accordance with the orthogonal conductor pattern, a wiring length between these points is $\sqrt{2}$ times, at the maximum, of the straight diagonal distance, thereby causing some problems, such as a lag in signal transmission and a voltage drop. In addition, the increased wiring length results in a longer length of the entire conductor than required, thereby not achieving a high density of wiring.

To avoid the above mentioned problems, the use of an oblique straight conductor pattern has been proposed. Referring to FIG. 2, a typical known oblique pattern is illustrated in which conductors $PO_1$, $PO_2$, $PO_3$ and $PO_4$ extend obliquely at an angle of 45°, with two conductors passing between adjacent grid points arranged in the X direction and, also, between adjacent grid points arranged in the Y direction. It will be understood that the oblique conductor pattern layer, or the oblique pattern layer in combination with X-Y orthogonal conductor pattern layers, ensures a reduced wiring length compared with using only the orthogonal conductor pattern. However, as compared with the orthogonal conductor pattern illustrated in FIG. 1, the conductor spacing of the oblique pattern, i.e. the distance between two adjacent conductors, and also, the distance between a conductor and an adjacent through hole land are smaller, even though the conductor width may be made smaller. This has operational advantages. It will also be understood that the area between the conductors $PO_2$ and $PO_3$, and between the through holes $H_{11}$ and $H_{22}$, is not effectively used.

Figure 2:
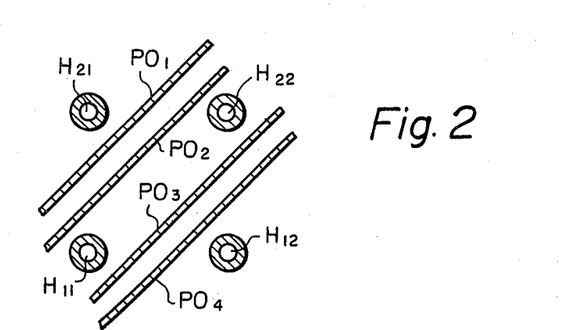
Figure 3:
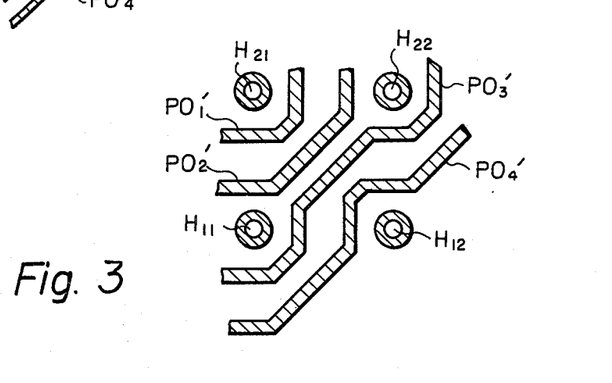

An improved conductor pattern for obviating these defects in the 45° oblique straight conductor pattern is illustrated in FIG. 3, in which conductors $PO_1'$, $PO_2'$, $PO_3'$ and $PO_4'$ extend in the form of zigzag lines without contacting the through holes. As a result, in comparison with the conductor pattern shown in FIG. 2, the distribution of the conductors is more uniform and there is substantially no area of non-use. However, the degree of meandering of the conductor is generally large, thereby resulting in an increase in the wiring length and also an increase in the parasitic inductance. Furthermore, the large degree of meandering of the conductor results in the design of the conductor pattern being complex and a requirement for a large size drawing machine, particularly in the case of automatic drawing by means of an electronic computer, due to a large number of turning points, and an increase in drawing time.

Furthermore, in the patterns shown in FIGS. 2 and 3, two conductors pass between adjacent through holes arranged in the X direction and in the Y direction, while four conductors pass between the through holes $H_{12}$ and $H_{21}$. This type of congestion of the conductor pattern can not be obviated in so far as the 45° oblique straight conductor pattern is concerned.

Regarding the design of the conductor pattern, there is a further problem, in that the number of conductors which can pass between the through holes at a predetermined distance depends on the width of the conductors, the conductor spacing, and the sizes of the through holes and of through hole lands. If the width of the conductors and/or the size of the through hole lands are made smaller, it is possible to ensure an increased number of conductors, as well as a required conductor spacing. However, a reduction in the width of the conductors and/or a reduction in size of the through hole lands are necessarily limited. In particular, if the through hole lands are reduced in size, a significant harmful effect may occur in a case wherein an eccentricity of the through holes with respect to the through hole lands exists.

SUMMARY OF THE INVENTION

It is, therefore, a primary object of the present invention to provide a printed board which ensures a high density and minimum length of wiring.

Another object of the present invention is to provide a printed board which allows a large tolerance in dimensions and facilitates the design of a conductor pattern and wiring, and the manufacture of the printed board.

The above and other objects of the present invention have been achieved with the printed board of the present invention, which is provided with an oblique and zigzag pattern, wherein conductors are formed along channels arranged in accordance with a principle that one conductor passes between adjacent grid points arranged in the X direction, and two or more conductors pass between adjacent grid points arranged in the Y direction, and each conductor obliquely extends in a zigzag line without contacting the grid points.

Preferably, the printed board is provided with through hole lands, each of which has at least an outer edge parallel to either the portion of the conductor passing between the grid points arranged in the X direction or the portion of the conductor passing between the grid points arranged in the Y direction.

Further, preferably, connecting points of the conductors and the through hole lands, as well as channel-changing points of the conductors, are selected from the turning points of the conductor and the intersecting points of the conductor portion passing between the grid points arranged in the Y direction with auxiliary grid lines located between the basic grid lines.

The present invention will become more apparent from the description of preferred embodiments set forth below with reference to the accompanying drawings.

DETAILED DESCRIPTION OF PREFERRED EMBODIMENT

As will be apparent from the above, various preferred embodiments of the printed board according to the present invention are illustrated in FIGS. 4 through 14.

Figure 4:
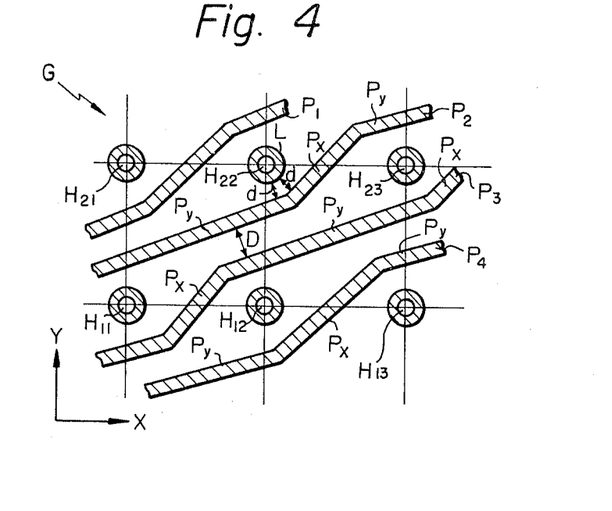
FIG. 4 illustrates an embodiment of a conductor pattern of a printed board according to the present invention.

Illustrated in FIG. 4 are a plurality of through holes $H_{11}$, $H_{12}$, $H_{13}$, $H_{21}$, $H_{22}$ and $H_{23}$, through hole lands L, and a plurality of conductors $P_1$, $P_2$, $P_3$ and $P_4$. The through holes and the through hole lands are located on the intersecting points (i.e. grid points) of the X-Y orthogonal basic grid designated generally by "G". It should be noted here that the basic grid G and the X-Y orthogonal coordinate axes shown in FIG. 4 are similarly applied to all of FIGS. 5 through 14.

The conductors $P_1$, . . . , $P_4$ are formed along channels, which extend obliquely in the form of zigzag lines without contacting the through hole lands L, in accordance with a principle that one conductor passes between two adjacent through holes arranged in the X direction (for example, $H_{11}$ and $H_{12}$, $H_{12}$ and $H_{13}$), while two conductors pass between the adjcent through holes arranged in the Y direction (for example, $H_{11}$ and $H_{21}$, $H_{12}$ and $H_{22}$, $H_{13}$ and $H_{23}$). Each of the conductors extends obliquely at such a mean gradient that the conductor advances one grid pitch in the Y direction as it advances two grid pitches in the X direction. The conductor is formed by alternate repetition of a straight portion $P_X$ passing obliquely between the grid points arranged in the X direction and another straight portion $P_Y$ passing obliquely between the grid points arranged in the Y direction. The conductor portions $P_X$ and $P_Y$ are different in gradient from each other, but the portions $P_X$ of the respective conductors are parallel to each other, while the portions $P_Y$ of the respective conductors are parallel to each other.

Figure 5:
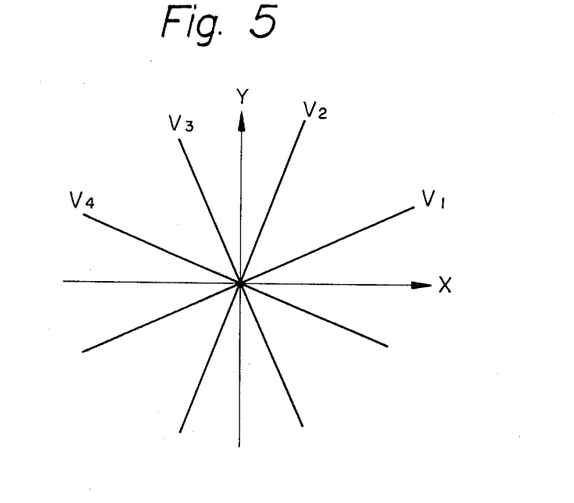
FIG. 5 illustrates various possible directions of the conductor pattern illustrated in FIG. 4, with respect to a basic grid.

In the above described pattern, only three conductors $P_1$, $P_2$ and $P_3$ pass between the through holes $H_{12}$ and $H_{21}$ arranged diagonally, and accordingly, the degree of congestion of the conductor pattern is lowered as compared with the known zigzag pattern shown in FIG. 3. In addition, the fact that only one conductor passes between the grid points arranged in the X direction allows a reduction of the degree of meandering compared with that of FIG. 3, thereby obviating the aforementioned defects, such as an increase in the wiring length, an increase in the parasitic inductance and complexity in the drawings. Furthermore, with regard to this type of oblique pattern having conductors at an angle other than 45°, there are four kinds of conductor layers as shown in FIG. 5. FIG. 5 illustrates the axes $V_1$, $V_2$, $V_3$ and $V_4$ indicating the pattern directions of conductor layers with respect to the X-Y orthogonal coordinate axes. In a case wherein these kinds of conductor layers are combined with the X and Y orthogonal conductor layers, it is possible to achieve a wiring length between two desired points approximating the minimum straight distance with a high degree of accuracy. It will be appreciated that, with the 45° oblique pattern of the prior art, there are only two kinds of patterns and, accordingly there is a low degree of accuracy of approximating the wiring length.

Figure 6:
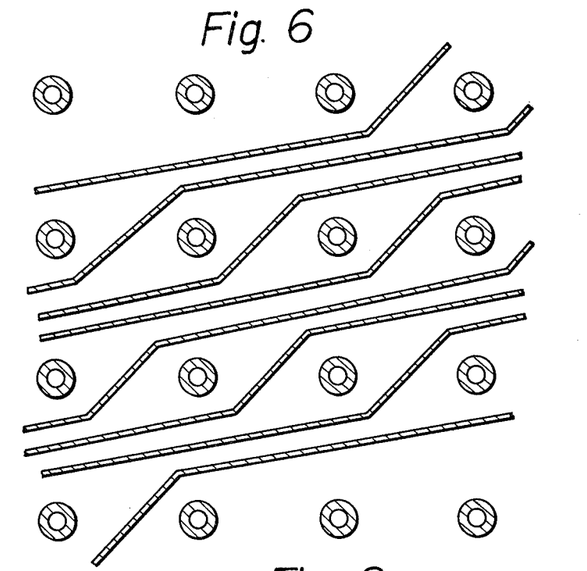
FIG. 6 illustrates another embodiment of the conductor pattern of the printed board according to the present invention.

Illustrated in FIG. 6 is a second embodiment of the conductor pattern according to the present invention, in which one conductor passes between the grid points arranged in the X direction, while three conductors pass between the grid points arranged in the Y direction.

The oblique and zigzag pattern at a gradient of 1:n (i.e., Y:X where n is an integer equal to or more than two, i.e. $n \geq 2$) as described above, according to the present invention, brings about the following advantages:

(a) Since one or more through hole lands are positively interposed between the adjacent conductors, the mean distance between the conductors is larger than that in FIGS. 1 through 3, thereby resulting in a reduction of cross talk.

(b) As mentioned hereinbefore with reference to FIG. 5, it is possible to provide six kinds of pattern directions ($V_1$, $V_2$, $V_3$, $V_4$, X and Y) for a multilayer printed board. This fact ensures a shorter wiring length, as compared with both the case of only two pattern directions X and Y, and the case of four pattern directions wherein two 45° oblique patterns are added. It also ensures a reduction in the number of through holes used for changing the directions of the wiring.

(c) The increase in the number of pattern directions further ensures the reduction of cross talk between the conductor layers.

(d) The reduction of the cross talk both between adjacent conductors and between conductor layers allows for a greater variation in the parallel conductor lengths, thereby facilitating the design of the wiring routes.

(e) The process of drawing the pattern is not complicated.

One example of the oblique and zigzag pattern of the present invention was found by the inventors to have a density of conductors 1.12, a mean wiring length 0.83 and an effective wiring density 1.39 times that of an X-Y orthogonal pattern with the same conductor width and number of through holes.

However, the above described improved oblique pattern having conductor at angles other than 45° involves a new problem in that while a sufficient distance "D" (FIG. 4) between the adjacent conductors can be ensured, a distance "d" (FIG. 4) between a through hole land L and the conductor adjacent thereto is not always completely satisfactory. It will be understood that this problem becomes more remarkable as the number of the conductors passing between the grid points arranged in the Y direction is made larger, such as the three conductors shown in FIG. 6, or more than the three. Of course, if the width of the conductor and/or the size of the through hole land are made smaller, it is possible to make the distance "d" larger. However, this expedient has its limitation also. In particular, the reduction in the size of the through hole lands may cause operational disadvantages due to an eccentricity of the through hole with respect to the through hole land.

Therefore, another object of the present invention is to provide an improved through hole land which has a large area and yet ensures the required distance between the through hole land and the conductor adjacent thereto, for obviating the afore-mentioned problems, thereby ensuring a printed board with a high wiring density.

Figure 7:
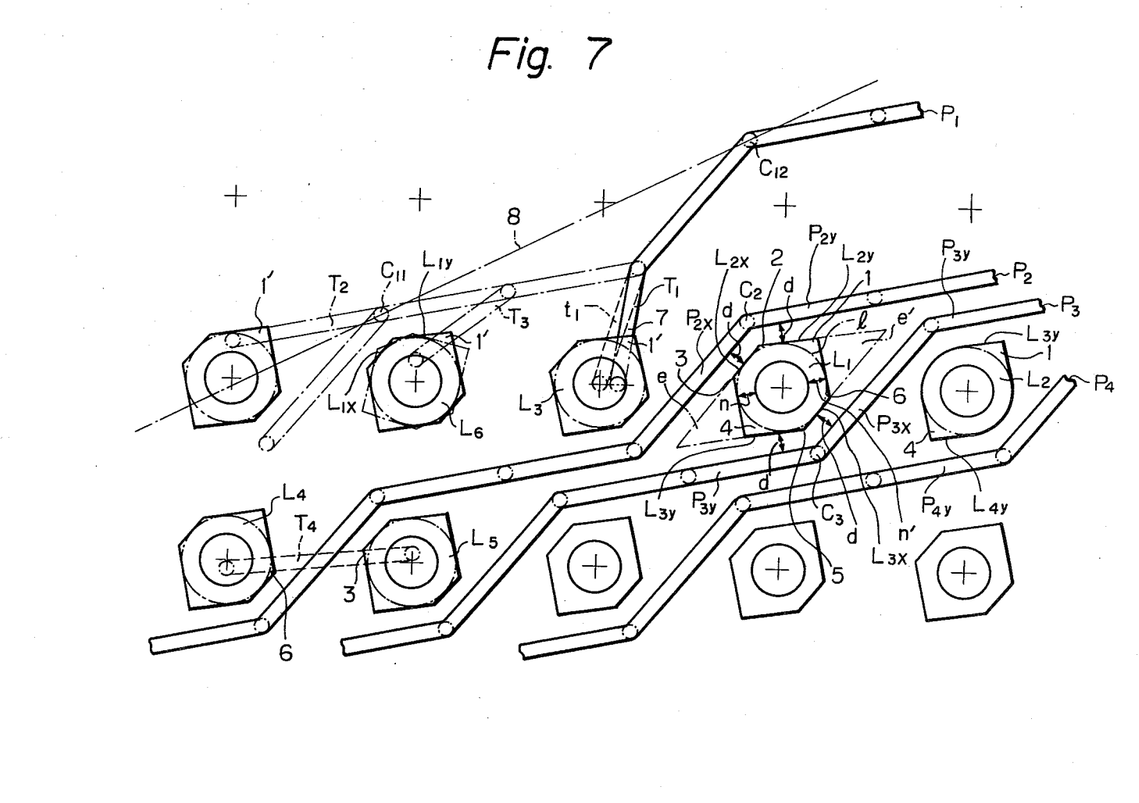
FIG. 7 illustrates various embodiments of the through hole land of the printed board according to the present invention.

An explanation of various embodiments of the through hole land according to the present invention will now be set forth with reference to FIG. 7. In FIG. 7, the conductors $P_1$, $P_2$, $P_3$ and $P_4$ are similar to those shown in FIG. 4, that is, each conductor advances one grid pitch in the Y direction as it advances two grid pitches in the X direction. Firstly, a through hole land $L_1$ interposed between two adjacent conductors $P_2$ and $P_3$ will be explained. The conductors $P_2$ and $P_3$ have turning points $C_2$ and $C_3$, respectively. Portions $P_{2X}$ and $P_{2Y}$ of the conductor $P_2$ on the opposite sides of the turning point $C_2$ and portions $P_{3X}$ and $P_{3Y}$ of the conductor $P_3$ on the opposite sides of the turning point $C_3$ surround an area in the parallelogram form. The land $L_1$ has outer straight edges $L_{2X}$ and $L_{3X}$ which are adjacent and parallel to the conductor portions $P_{2X}$ and $P_{3X}$ passing between grid points arranged in the X direction, respectively. The land $L_1$ also has outer straight edges $L_{2Y}$ and $L_{3Y}$ which are adjacent and parallel to the conductor portions $P_{2Y}$ and $P_{3Y}$ passing between grid points arranged in the Y direction, respectively. The distances "d" between the conductor portions and the corresponding land edges are so determined that they ensure a minimum gap essential for insulation therebetween. The land $L_1$ may be in a basic parallelogram form similar to that defined by the conductor portions $P_{2X}$, $P_{2Y}$, $P_{3X}$ and $P_{3Y}$, but pointed end portions e and e', shown by chain lines in FIG. 7, are removed by etching, because they are unnecessary, with lengths n and n' essential as parts of the land only being left.

The polygonal land $L_1$ has an effective area for the through hole land which is larger than that of the normal circular land l, shown by a chain line, by the entire corner portions 1 through 6 on the outside of the circular land. Accordingly, as compared with the circular land, it is possible to allow a larger dimensional error caused by a displacement of a drill in a drilling process, and yet ensure the required distance between the land $L_1$ and the conductors $P_2$ and $P_3$ essential for insulation.

A through hole land $L_2$ of a lemon-like shape is a variation of the polygonal land $L_1$, wherein the corner portions 2, 3, 5 and 6 of the polygonal land $L_1$ are removed, leaving only the sharpest corner portions 1 and 4. In this case, an effective increase in the area of the land over that of the conventional circular land can also be obtained due to the existence of the sharpest and largest corner portions 1 and 4. Moreover yet it is easier to form the land $L_2$ by etching than the land $L_1$ due to the relatively round shape.

The lemon-shaped land $L_2$ also has outer straight edges $L_{3Y}$ and $L_{4Y}$, which are parallel to conductor portions $P_{3Y}$ and $P_{4Y}$ passing between the grid points arranged in the Y direction, respectively. Therefore, this land also is based on substantially the same principle as that applied to the polygonal land $L_1$.

The polygonal land $L_1$ and the lemon-shaped land $L_2$ sometimes involve a problem such as between the conductor $P_1$ and the land $L_3$ is made at a place shown by a dotted line $t_1$. In this case some defects may be caused in forming the conductor pattern by etching. The connecting portion shown by the dotted lines $t_1$ is based on a normal practice that the connecting portion should be oriented toward the center of the land (i.e. the center of the through hole). In this practice, however, a corner portion 1' of the land $L_3$ and the connecting portion $t_1$ define an acute notch 7 therebetween. The existence of such an acute notch is undesirable in the design of a conductor pattern, because the required etching is difficult in that the conductor is made narrow, interrupted or the like at the notch.

The problem of the acute notch that may be caused by adoption of the polygonal land or the lemon-shaped land can be obviated in the following manner according to the present invention. That is, in connecting the land $L_3$ to conductor $P_1$, a connecting portion shown by a solid line $T_1$ is arranged so that the land corner portion 1' is contained within the width of the connecting portion $T_1$. This arrangement prevents defining of an acute notch, thereby obviating the above mentioned problems concerning etching. It should be noted that, although the conductor $T_1$ is arranged to contain the land corner portion 1' therein, and thus, is orientated toward a point other than the land center, there are substantially no problems caused by this arrangement. Connecting portions $T_2$ and $T_3$, shown by chain lines, are other similar embodiments arranged so that the corner portions 1' are contained within these connecting portions.

Connecting portion $T_4$, shown by a chain line, is provided for connecting two adjacent through hole lands $L_4$ and $L_5$ to each other in a layer in which there is no conductor passing between the lands $L_4$ and $L_5$. In this case, the land corner portions adjacent to the connecting portion $T_4$ are the corner portion 6 of the land $L_4$ and the corner portion 3 of the land $L_5$. Accordingly, the connecting portion $T_4$ is offset from the centers of the lands $L_4$ and $L_5$ so that the corner portions 6 and 3 are contained within the width of the connecting portion.

The hexagonal land, such as $L_1$, has six corner portions which can possibly define acute notches with the connecting portions, while the lemon-shaped land, such as $L_2$, has only two such corner portions. The forming of an acute notch can be prevented in the lemon-shaped land in the same manner as in the hexagonal land.

As aforementioned, it is a principle of the invention that the conductors $P_1$, $P_2$, etc. extend obliquely in the form of zigzag lines without coming into contact with the grid points, so that one conductor passes between the grid points arranged in the X direction and a plurality of conductors pass between the grid points arranged in the Y direction. There will be situations, however, in certain conductor layers or in certain regions in an identical conductor layer of a printed board where, even if the conductor is formed in a straight line without meandering, the conductor does not interfere with the through hole lands. In this case, it is desirable to form the conductor in a straight line so that its length is minimized. The gradient of the straight conductor is equal to a mean angle over the entire length of the zigzag conductor $P_1$, $P_2$, etc. For the conductor $P_1$, there is the angle of a line 8 extending along one zigzag pattern section such as, the section between the turning points $C_{11}$ and $C_{12}$. Assuming that a straight conductor extends along the line 8, outer edges $L_{1X}$ and $L_{1Y}$ of a land $L_6$ are not parallel to the straight conductor. Therefore, in such a case, the land $L_6$ is formed in a shape as shown by a chain line, which shape corresponds to that which would be obtained by turning the land $L_6$ about its center, so that either the outer edge $L_{1X}$ or $L_{1Y}$ is made parallel to the conductor along the line 8. As a result, it is to possible to ensure a required large distance between the land 6 and the straight conductor, and also, a large land area. Making at least one of the outer straight edges of the land parallel to the straight conductor, such as $L_1$, can also be applied to the the lemon-shaped land, such as $L_2$.

The present invention has as a further object to provide an arrangement for connections between oblique conductors and through hole lands, and for changing the channel of the conductors.

Figure 8:
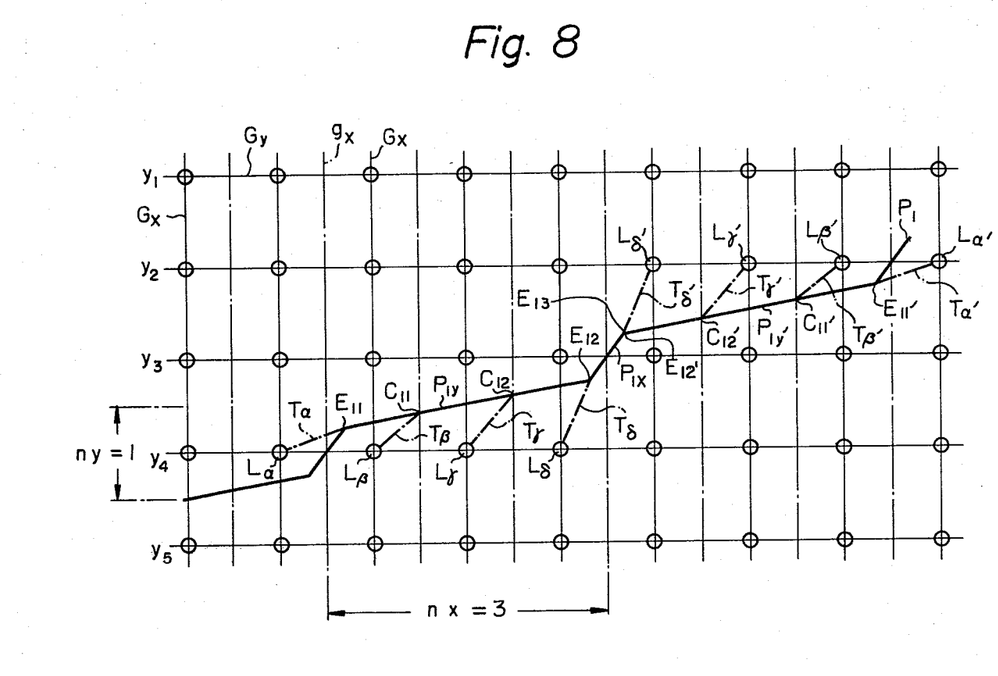
FIGS. 8 through 13 illustrate various possible routes for connections between the conductors and the through hole lands of the printed board according to the present invention.
Figure 9:
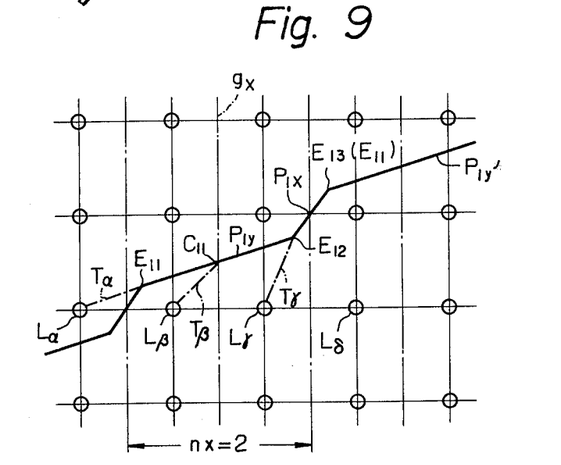

As explanation of various embodiments of connections between the oblique conductors and the through hole lands will now be set forth with reference to FIGS. 8 through 13. In FIG. 8, a zigzag conductor $P_1$ is similar to the conductor shown in FIG. 6, and meanders obliquely at the gradient of one grid pitch in the Y direction, i.e. $nY=1$, and three grid pitches in the X direction, i.e. $nX=3$. The zigzag conductor $P_1$ is formed by repetition of a zigzag pattern section extending between turning points $E_{11}$ and $E_{13}$. The zigzag pattern section is composed of a portion $P_{1Y}$ extending between the turning points $E_{11}$ and $E_{12}$, and passing between the grid points arranged in the Y direction, and a portion $P_{1X}$ extending between the turning points $E_{12}$ and $E_{13}$, and passing between the grid points arranged in the X direction. The connections between the conductors and the through holes are made on the basis of the following principle.

As an example, a situation is described wherein the conductor $P_1$ is connected to a row of through hole lands $Y_4$ extending in the X direction. The zigzag pattern section between the points $E_{11}$ and $E_{13}$ contain two turning points $E_{11}$ and $E_{12}$ in the portion facing the row of through hole lands $Y_4$. In accordance with a principle of the present invention, these turning points $E_{11}$ and $E_{12}$ are connected respectively to through hole lands $L_\alpha$ and $L_\delta$, which are located on the left side ($-X$ side) of and most adjacent to these turning points. The turning points are connected to the hole lands by the connecting portions $T_\alpha$ and $T_\delta$, as shown by chain lines in FIG. 8. In the case shown in FIG. 9 wherein $nX=2$ (as opposed to $nX=3$), the turning point $E_{12}$ is connected to the land $L_\gamma$ located one grid pitch to the left side ($-X$ side) of the land $L_\delta$.

In accordance with another principle of the present invention, and as illustrated in FIG. 8 an auxiliary grid is additionally provided wherein intersections of the auxiliary grid lines with the conductor portion $P_{1Y}$ pass between the grid points arranged in the Y direction and are connected to the lands. For example, auxiliary grid lines gX are located at ½ pitch of the basic grid lines GX, as shown by chain lines in FIG. 8. The intersections $C_{11}$ and $C_{12}$ of the auxiliary grid lines gX with the conductor portion $P_{1Y}$ passing between the grid points arranged in the Y direction are used as terminal points of the connecting portions. The intersections $C_{11}$ and $C_{12}$ are connected to lands $L_\beta$ and $L_\gamma$ by connecting portions $T_\beta$ and $T_\gamma$, shown by chain lines. The lands $L_\beta$ and $L_\gamma$ are located on the left side ($-X$ side) of and most adjacent to these respective intersections. In the case shown in FIG. 9 wherein $nX=2$ (as opposed to $nX=3$), there is only one intersection $C_{11}$ of the auxiliary grid line gX with the conductor portion $P_{1Y}$, and this intersection $C_{11}$ is connected to the land $L_\beta$ located on the left side ($-X$ side) of and most adjacent to this intersection, via a connecting portion $T_\beta$, shown by a chain line.

Although the above description concerns embodiments of the inventions wherein the conductor portion $P_{1Y}$ is connected to the row of lands adjacent thereto on the underside ($-Y$ side) thereof, the conductor portion also can be connected to the row of lands adjacent thereto on the upper side ($+Y$ side) employing the same principle as mentioned above. Therefore, the connections between a row of through hole lands $Y_2$ and a conductor portion $P_{1Y}$ are as illustrated in FIG. 8. It will be understood these connections have a pattern which would be obtained by reversing in a 180° pattern of the aforementioned array of connections between the conductor portion $P_{1Y}$ and the row of through hole lands $Y_4$.

As can be seen from the above, in accordance with the present invention, one oblique conductor can be connected, at the section extending over one grid pitch in the Y direction, to nx plus one ($nx+1$) of the lands. Furthermore, the above mentioned connections are based on the principle that the lands adjacent to the turning points $E_{11}$ and $E_{12}$ are connected to these turning points, and the lands not adjacent to the turning points $E_{11}$ and $E_{12}$ are connected to the intersections $C_{11}$ and $C_{12}$ of the conductor with the auxiliary grid lines. This practice, as compared with a case wherein any desired point of the conductor is connected to the lands, facilicates the design of the wiring, particularly when using design automotion (DA).

Figure 10:
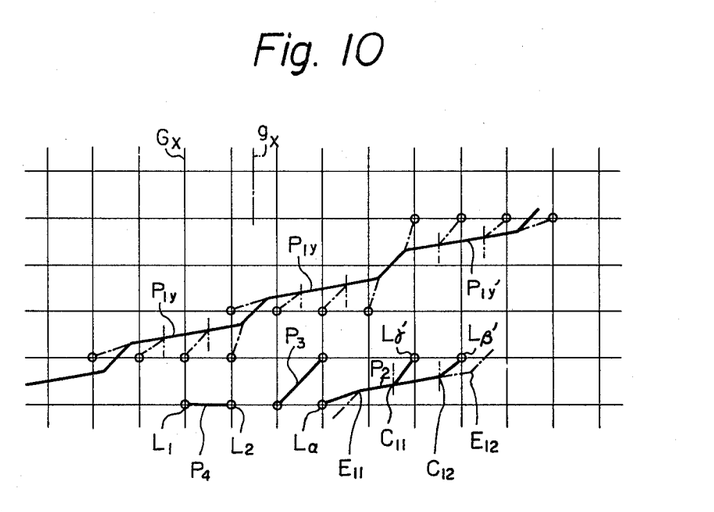

In FIGS. 10 though 12, several other embodiments of connections between the conductors and the through hole lands are illustrated on the basis of the aforementioned principle. Referring to FIG. 10, two conductor portions $P_{1Y}$ can be connected to rows of through hole lands adjacent thereto on the under side ($-Y$ side) thereof, respectively, via any selection of the various routes shown by the chain lines. The conductor portion $P_{1Y}'$ can be connected to a row of through hole lands adjacent thereto on the upper side ($+Y$ side) thereof, via the various routes shown by the chain lines. The conductor $P_2$ is illustrated as an embodiment of a connection between a land and two other lands, wherein the lower land $L_\alpha$ is connected to the upper lands $L_{\gamma}'$ and $L_{\beta}'$. In this case also, the conductor $P_2$ and the land $L_{60}$ are connected to each other at the turning point $E_{11}$, and the conductor $P_2$ and the lands $L_{\gamma}'$ and $L_{\beta}'$ are connected to each other at the intersections $C_{11}$ and $C_{12}$ of the conductor $P_2$ with auxiliary grid lines. The conductor $P_3$ is shown as an embodiment of an oblique conductor interconnecting two through hole lands directly. The conductor $P_4$ is shown as an embodiment of a direct connection between two adjacent through hole lands arranged in the direction X. As can be understood from an embodiment shown in FIG. 13 in the form of conductors $P_{41}$ and $P_{42}$, it is possible to interconnect three or more lands arranged in a row, by repetition of the connection between two adjacent lands on the identical grid line.

Figure 11:
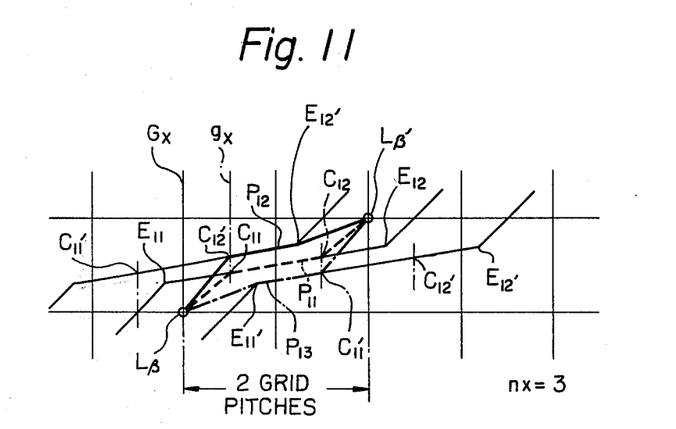

FIG. 11 illustrates various possible routes for interconnecting two through hole lands $L_\beta$ and $L_\beta'$ between two grid pitches where nX=3. A conductor $P_{11}$, which corresponds to the conductor portion $P_{1Y}$ in FIG. 8, is connected from the intersections $C_{11}$ and $C_{12}$ thereof with the auxiliary grid lines to the land $L_\beta$ on the under side (−Y side) and the land $L_\beta'$ on the upper side (+Y side), respectively. In the case of nX=3, three conductors $P_{11}$, $P_{12}$ and $P_{13}$ pass between two adjacent grid points arranged in the Y direction. Accordingly, the lands $L_\beta$ and $L_\beta'$ can be also interconnected to the conductors $P_{12}$ and $P_{13}$, in addition to the conductor $P_{11}$. The conductor $P_{13}$ is connected at the turning point $E_{11}'$ and at the intersection $C_{11}'$ thereof with an auxiliary grid line to the lands $L_\beta$ and $L_\beta'$, respectively. The conductor $P_{12}$ is connected at the intersection $C_{12}'$ thereof with an auxiliary grid line and at the turning point $E_{12}'$ to the lands $L_\beta$ and $L_\beta'$, respectively.

Figure 12:
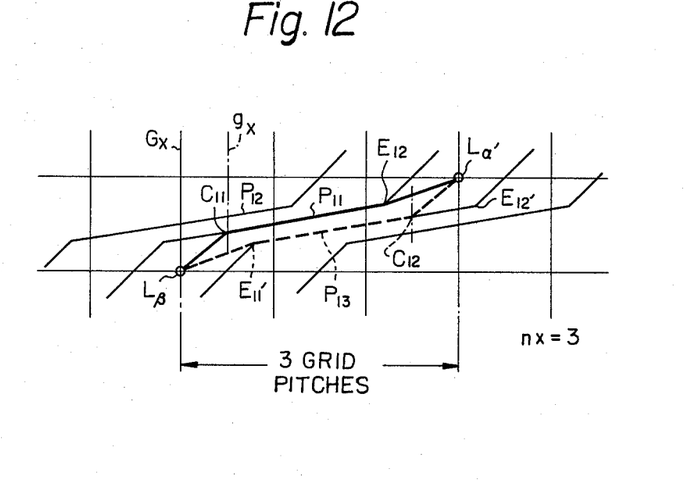
Figure 13:
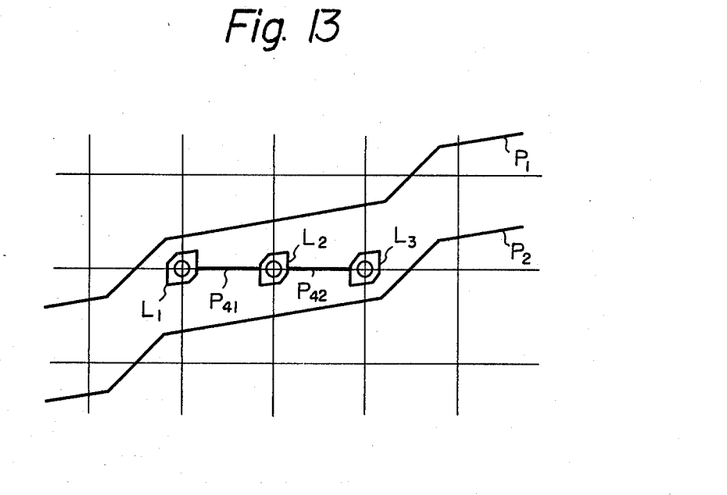

FIG. 12 illustrates various possible routes for interconnecting two through hole lands $L_\beta$ and $L_\alpha'$ between three grid pitches where nX=3. In this case, there are two possible routes via the conductors $P_{11}$ and $P_{13}$, respectively.

It will be understood from the above that, according to the present invention, since two or more conductors pass obliquely between two adjacent grid points arranged in the Y direction, there are various possible routes for connection between desired through hole lands. This fact brings about an increase in versatility in the wiring design, thereby facilitating highly dense and what normally would be considered complicated wiring.

Figure 14:
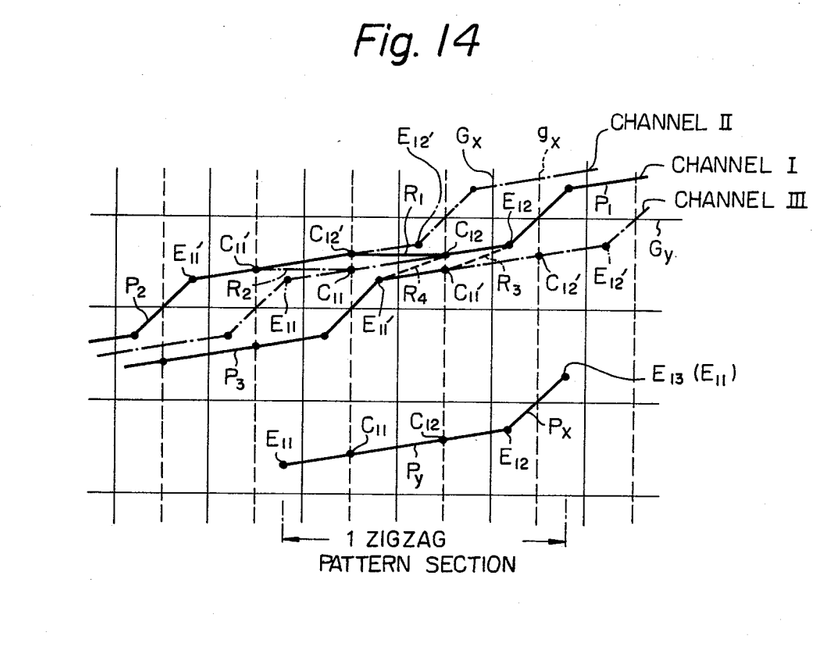
FIG. 14 illustrates various possible routes for changing the channel of the conductor.

A description will now be set forth concerning the changing of channels of the conductor, with reference to various embodiments illustrated in FIG. 14. In FIG. 14, a conductor $P_1$ is in a channel I, with a conductor $P_2$ in a channel II extending on the upper side (+Y side) and a conductor $P_3$ in a channel III extending on the under side (−Y side). In a case wherein the conductor $P_1$ is transferred from the channel I to the channel II and is connected to the conductor $P_2$, the intersection $C_{12}$ of the conductor $P_1$ with an auxiliary grid line is connected to the intersection $C_{12}'$ of the conductor $P_2$ with an auxiliary grid line, via a connecting portion $R_1$ shown by a solid line. In the situation where nX=3, there are two intersections $C_{11}$ and $C_{12}$ with auxiliary grids between turning points. Accordingly, it is also possible to connect the intersections $C_{11}$ of $P_1$ with the intersection $C_{11}'$ of $P_2$, via a connecting portion $R_2$, shown by a chain line. Where nX=2, there is only one possible route for the transfer.

As will be apparent from the above, in a case wherein the conductor in a certain channel is transferred to another channel on the upper side (+Y side) thereof, the interconnection of those conductors between the respective intersections of the conductors with the auxiliary grid lines ensures a gentle directional turn of the conductor. This eliminates defects, such as a constricted portion of the conductor caused by a sharp turning of the conductor during the etching.

In a case wherein the conductor is transferred from a channel, such as the channel I, to a channel on the under side (−Y side), such as channel III, the turning point $E_{12}$ and the intersection $C_{11}'$ of the channel III with an auxiliary grid line are interconnected via a connecting portion $R_3$, shown by a dotted line. In the situation where nX=3, the intersection $C_{12}$ of the channel I with an auxiliary grid line and the turning point $E_{11}'$ may be alternatively interconnected via a connecting portion $R_4$, shown by a dotted line. It will be appreciated that, in a case of nX=2, there is only one possible route, because each conductor has only one intersection thereof with the auxiliary grid line. Accordingly, the turning points would have to be interconnected. As mentioned above for transfer of a conductor to an upper channel, it is also true that, in the case wherein the conductor is transfered to the channel on the under side (−Y side) thereof the larger the number nX, the larger the number of possible transfer routes. Sharp turns of the conductor is also reduced, thereby reducing defects.

From the above description, it will be appreciated that, according to the present invention, the use of the basic grid for determining the locations of the through holes, the use of the auxiliary grid at a predetermined pitch, the use of the intersections of the auxiliary grid with the zigzag conductor, and the use of the turning points of the zigzag conductor permit selection of the points for interconnections between the conductors and the through hole lands, and also between the conductors, in an identical conductor layer, without use of the through holes, on the basis of a predetermined standard. These principles, as compared to the case wherein any desired point is used as the connecting point, facilitate the design of the wiring and conductor pattern and, more particularly, brings about remarkable results when DA is employed.

It should be appreciated that the invention has been described above in detail with particular reference to preferred embodiments thereof, but variations and modifications can be made thereto within the spirit and scope of the invention.

What we claim is:

1. A printed board comprising:
    a board having a plurality of through holes formed therein and located on intersecting points of an X-Y orthogonal basic grid, and an oblique conductor pattern formed on said board, wherein conductors are formed along channels, one conductor passes between adjacent grid points arranged in an X direction, two or more conductors pass between adjacent grid points in a Y direction, and each conductor obliquely extends in a zigzag line with the meandering being regularly repeated so as to not contact the grid points.

2. A printed board according to claim 1, wherein each said conductor extends obliquely at a mean gradient that of one grid pitch advancement in the Y direction to advancement of two or more grid pitches in the X direction.

3. A printed board according to claim 1, wherein each said conductor is in the form of alternate repetition of a first straight portion passing obliquely between grid points arranged in the X direction and a second straight portion passing obliquely between grid points arranged in the Y direction, said first and second portions being different in gradient from each other.

4. A printed board according to claim 3, further comprising through hole lands, wherein each said through hole land has at least an outer straight edge parallel to either said first or second portion of the conductor adjacent thereto.

5. A printed board according to claim 4, wherein each said through hole land has a lemon-like shape.

6. A printed board according to claim 4, wherein each said through hole land has a polygonal shape.

7. A printed board according to claim 4, further comprising portions for connecting the conductors to the through hole lands, wherein said connecting portion is arranged to contain therein at least a corner portion of the through hole land, whereby the angle defined between the outer edge of the through hole land and the connecting portion is equal to or larger than a right angle.

8. A printed board according to claim 1, wherein connecting points of the conductors to the through hole lands and channel-changing points of the conductors are selected on the basis of the turning points of the conductors, and the intersections of the portions of the conductors passing between the basic grid points arranged in the Y direction with auxiliary grid lines provided between the basic grid lines.

9. A printed board according to claim 8, wherein the conductors and the through hole lands are connected together so that the lands adjacent to the turning points of the conductors are connected to these adjacent turning points, and the lands not adjacent to the turning points of the conductors are connected to the intersections of the conductors with the auxiliary grid lines.

10. A printed board according to claim 4, wherein said through hole lands have either lemon-like or polygonal shapes.

11. A printed board according to claim 5, 6 or 10 further comprising portions for connecting the conductors to the through hole lands, wherein said connecting portions are connected to respective through hole lands so as to contain at least a corner portion of the respective through hole land within the connecting portion.

12. A printed board according to claim 8 or 9 wherein the auxiliary grid lines include auxiliary grid lines arranged in the X direction located at ½ pitch of the basic grid lines in the X direction.

13. A printed board comprising:
(a) a board having (i) a plurality of through holes formed therein and located on intersecting points of an X-Y orthogonal basic grid and (ii) through hole lands, and
(b) an oblique conductor pattern formed on said board having (i) conductors formed along channels, one conductor passing between adjacent grid points arranged in an X direction, two or more conductors passing between adjacent grid points arranged in a Y direction, and each conductor obliquely extending in a zigzag line so as to not contact the grid points at a mean gradient of one grid pitch in the Y direction to at least two or more grid pitches in the X direction with each conductor formed in alternate repetition of a first straight portion passing obliquely between grid points arranged in the X direction and a second straight portion passing obliquely between grid points arranged in the Y direction, said first and second portions being different in gradient from each other, and (ii) portions for connecting the conductors to the through hole lands wherein connecting points of the conductors to the through hole lands and channel-changing points of the conductors are selected on the basis of the turning points of the conductors, and the intersections of the portions of the conductors passing between the basic grid points arranged in the Y direction with auxiliary grid lines provided between the basic grid lines, and wherein the conductors and the through hole lands are connected together so that the lands adjacent to the turning points of the conductors are connected to these adjacent turning points, and the lands not adjacent to the turning points of the conductors are connected to the intersections of the conductors with the auxiliary grid lines.

14. The printed board of claim 13, wherein each said through hole land has at least an outer straight edge parallel to either said first or second portion of the conductor adjacent thereto and has either a lemon-like or polygonal shape and wherein said through hole lands are connected to respective conductors by the connecting portion so as to contain at least a corner portion of the respective through hole land within the corresponding connecting portion.

* * * * *

UNITED STATES PATENT AND TRADEMARK OFFICE
CERTIFICATE OF CORRECTION

PATENT NO. : 4,298,770
DATED : November 3, 1981
INVENTOR(S) : Mikio Nishihara et al.

It is certified that error appears in the above—identified patent and that said Letters Patent is hereby corrected as shown below:

```
Front page, [56] References Cited,
         line 3, after "Hill" insert --et al.--;
         line 6, after "Schwartz" insert --et al.--;
         line 7, after "LaGrange" insert "et al.".
Column 2, line 3, "advantages" should be --disadvantages--.
Column 5, line 6, "conductor" should be --conductors--;
Column 5, line 19, "limitation" should be --limitations--.
Column 6, line 8, "yet" should be --,--;
Column 6, line 22, "lines" should be --line--.
Column 7, line 24, after "is" delete "to".
Column 8, line 2, after "8" insert --,--;
Column 8, line 66, "$L_{60}$" should be --$L_\alpha$--.
Column 10, line 23, "is" should be --are--.
```

Signed and Sealed this

Twenty-second Day of June 1982

[SEAL]

Attest:

Attesting Officer

GERALD J. MOSSINGHOFF

Commissioner of Patents and Trademarks